(12) United States Patent
Halbritter

(10) Patent No.: US 9,606,231 B2
(45) Date of Patent: Mar. 28, 2017

(54) OPTOELECTRONIC APPARATUS

(71) Applicant: OSRAM Opto Semiconductors GmbH, Regensburg (DE)

(72) Inventor: Hubert Halbritter, Dietfurt (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 142 days.

(21) Appl. No.: 14/423,429

(22) PCT Filed: Aug. 22, 2013

(86) PCT No.: PCT/EP2013/067449
§ 371 (c)(1),
(2) Date: Feb. 23, 2015

(87) PCT Pub. No.: WO2014/029839
PCT Pub. Date: Feb. 27, 2014

(65) Prior Publication Data
US 2015/0301176 A1    Oct. 22, 2015

(30) Foreign Application Priority Data
Aug. 23, 2012   (DE) .................. 10 2012 107 794

(51) Int. Cl.
*H01J 40/14*     (2006.01)
*G01S 17/08*     (2006.01)
(Continued)

(52) U.S. Cl.
CPC .............. *G01S 17/08* (2013.01); *G01S 7/481* (2013.01); *G01S 7/4813* (2013.01);
(Continued)

(58) Field of Classification Search
CPC ....... G01S 7/4813; G01S 17/08; H01L 31/167
(Continued)

(56) References Cited

U.S. PATENT DOCUMENTS

| | | |
|---|---|---|
| 2006/0267124 A1 | 11/2006 | Yamazaki |
| 2007/0200130 A1 | 8/2007 | Behringer et al. |
| 2008/0049210 A1 | 2/2008 | Takaoka |
| 2010/0327164 A1 | 12/2010 | Costello et al. |
| 2011/0057104 A1* | 3/2011 | Yao ........................... G01J 1/32 250/338.1 |
| 2013/0015356 A1 | 1/2013 | Shih et al. |

FOREIGN PATENT DOCUMENTS

| | | |
|---|---|---|
| DE | 10 2008 014 349 A1 | 9/2009 |
| EP | 2 378 309 A1 | 10/2011 |

(Continued)

*Primary Examiner* — Kevin Pyo
(74) *Attorney, Agent, or Firm* — McDermott Will & Emery LLP

(57) ABSTRACT

The invention relates to an optoelectronic device (1) comprising a detector for receiving radiation and a frame (3). Said frame is provided with an opening (30), in which the detector is located. The frame extends vertically between a radiation penetration face (300) and a rear face (301). The opening has a lateral face (4) running obliquely to the vertical direction. The oblique lateral face from the top view of the radiation penetration face has a first sub-section (41) and a second sub-section (42). The first sub-section is designed as a reflector for the radiation that is to be received by the detector and the second sub-section guides radiation that is incident on the second sub-section in the vertical direction away from the detector.

16 Claims, 3 Drawing Sheets

(51) Int. Cl.
*H01L 31/167* (2006.01)
*H03K 17/94* (2006.01)
*H01L 31/0203* (2014.01)
*H01L 31/0232* (2014.01)
*G01S 17/02* (2006.01)
*G01S 7/481* (2006.01)
*G02B 5/10* (2006.01)
*H01L 25/16* (2006.01)

(52) U.S. Cl.
CPC .............. *G01S 17/026* (2013.01); *G02B 5/10* (2013.01); *H01L 31/0203* (2013.01); *H01L 31/02325* (2013.01); *H01L 31/167* (2013.01); *H03K 17/941* (2013.01); *H01L 25/167* (2013.01); *H01L 2224/48091* (2013.01); *H03K 2217/94108* (2013.01)

(58) Field of Classification Search
USPC ....... 250/221, 239, 338.1, 338.4; 257/81, 82
See application file for complete search history.

(56) References Cited

FOREIGN PATENT DOCUMENTS

| | | |
|---|---|---|
| JP | H0527034 A | 2/1993 |
| JP | 2002517002 A | 6/2002 |
| JP | 2003218398 A | 7/2003 |
| JP | 2005156549 A | 6/2005 |
| JP | 2005536716 A | 12/2005 |
| JP | P2006-32566 A | 2/2006 |
| JP | P2006-203111 A | 8/2006 |
| JP | 2006332412 A | 12/2006 |
| JP | 2008051764 A | 3/2008 |
| JP | 2011503842 A | 1/2011 |
| JP | 2011049473 A | 3/2011 |
| WO | 99/61938 A1 | 12/1999 |
| WO | WO-2009057057 A1 | 5/2009 |
| WO | WO-2009057075 A2 | 5/2009 |
| WO | 2012/155984 A1 | 11/2012 |

* cited by examiner

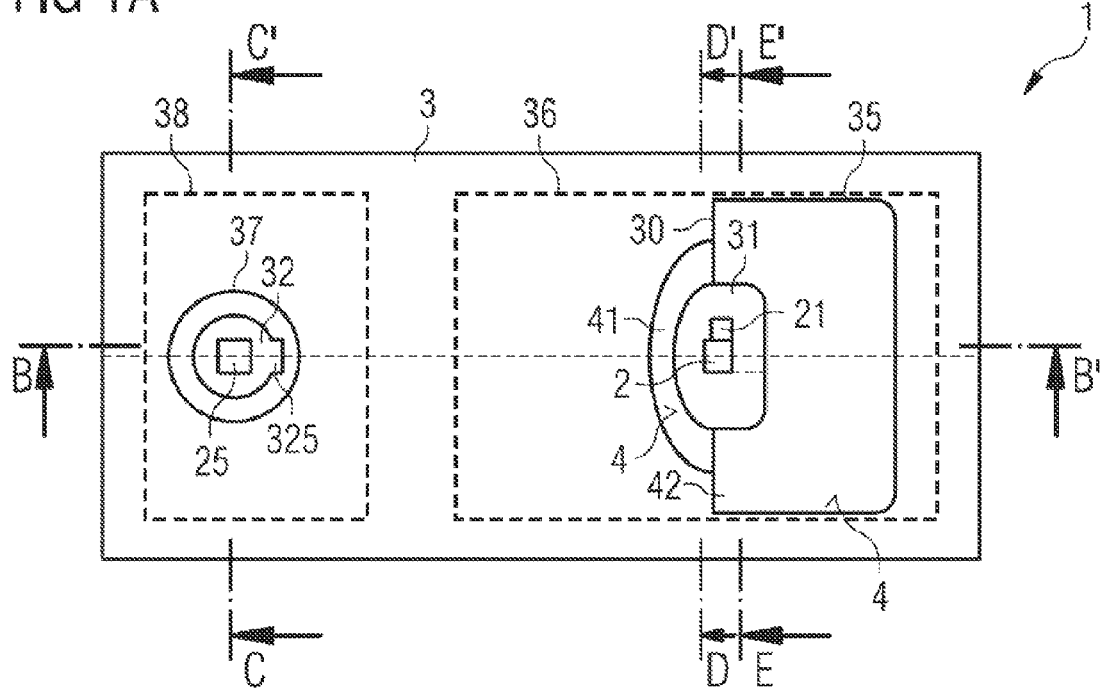
FIG 1A
FIG 1B
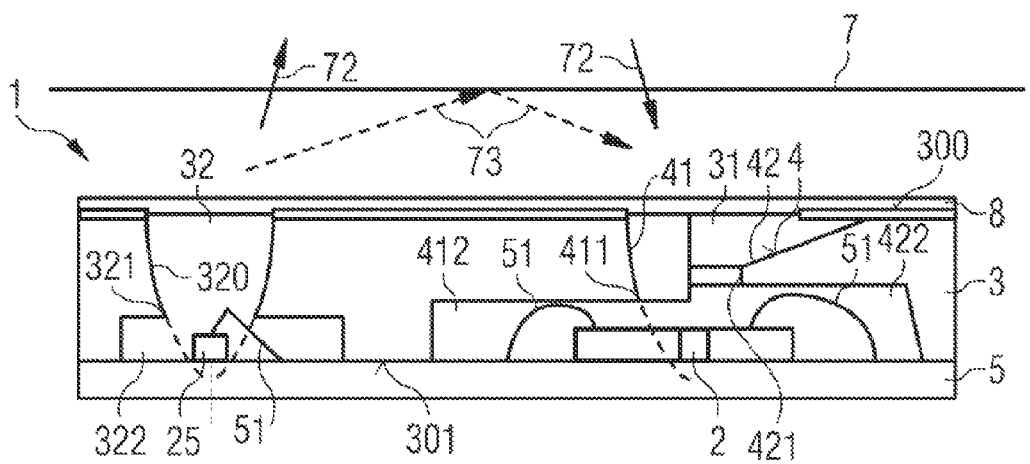

OPTOELECTRONIC APPARATUS

The present application relates to an optoelectronic apparatus.

In the case of optoelectronic apparatuses such as for example proximity sensors, the range depends inter alia on the radiant power impinging on the detector of the proximity sensor. Undesired radiation portions may however lead to distortion of the signal to be detected.

One object is to provide an optoelectronic apparatus with a detector, which apparatus is distinguished by a high sensitivity for the radiation to be detected.

According to at least one embodiment of the optoelectronic apparatus, said apparatus comprises a detector provided to receive electromagnetic radiation. The detector may for example be a photodiode, a phototransistor or an application-specific integrated circuit (ASIC) with a photosensitive region. In particular, the detector may be an unhoused semiconductor device, for example an unhoused semiconductor chip. The detector may be provided to receive radiation in the ultraviolet, in the visible or in the infrared spectral ranges. The detector is preferably provided detect radiation in the near infrared range (NIR; vacuum wavelength 750 nm to 1400 nm), particularly preferably in the wavelength range between 800 nm and 1000 nm inclusive.

According to at least one embodiment of the optoelectronic apparatus, the apparatus comprises a frame. Formed in the frame is an orifice, in which the detector is arranged. The frame may for example take the form of a plastics moulding. In a vertical direction the frame extends between a radiation passage side and a back. The vertical direction is a direction extending perpendicular to the radiation passage side. The radiation passage side and the back preferably extend parallel to one another at least in places. The frame is preferably made of a material which is radiation-opaque to the radiation to be detected.

The orifice preferably extends vertically completely through the frame. It thus extends from the radiation passage side to the back of the frame.

According to at least one embodiment of the optoelectronic apparatus, the orifice of the frame comprises a side face which extends obliquely to the vertical direction. This means that the side face does not extend parallel and not perpendicular to the vertical direction. The obliquely extending side face is visible in plan view onto the radiation passage side of the frame.

According to at least one embodiment of the optoelectronic apparatus, the obliquely extending side face has a first sub-region in plan view onto the radiation passage side. The first sub-region takes the form of a reflector for the radiation to be received by the detector. For example, the reflector may be shaped such that radiation impinging in the vertical direction onto the first sub-region is guided onto the detector. The first sub-region may be parabolic for example at least in places. In a sectional view in at least one direction, in particular in at least one direction extending perpendicular to the vertical direction, the first sub-region thus has the shape of part of a parabola. In particular, the side face of the first sub-region at least in places has the shape of a surface portion of a paraboloid of revolution. The detector may be arranged in the focal point of the parabolically shaped first sub-region.

According to at least one embodiment of the optoelectronic apparatus, the obliquely extending side face has a second sub-region. The second sub-region guides radiation impinging in the vertical direction on the second sub-region away from the detector. This means that perpendicularly impinging radiation reflected in directed manner at the second sub-region does not impinge directly, i.e. not without further reflection, on the detector. Preferably, the second sub-region is arranged and configured in such a way relative to the detector that radiation reflected diffusely at any desired angle by the second sub-region does not impinge directly on the detector.

The first sub-region and second sub-region of the side face are thus different from one another in the direction of the detector relative to the deflecting action for radiation impinging on the respective sub-regions. Radiation portions impinging from different directions or on different points of the side face thus make contributions of different significance to the signal of the detector. Preferably, the second sub-region is embodied such that the radiation impinging on this sub-region does not make any significant contribution to the signal.

The frame may be configured to reflect the radiation to be detected at least in places in directed manner and/or diffusely. In this context, configured to reflect means that the reflectivity for the radiation to be received by the detector amounts to at least 50%, preferably at least 60%.

Alternatively or in addition, the frame for the radiation to be detected may be configured to be absorbing at least in places. In this context, configured to be absorbing means that at least 50%, particularly preferably at least 80% of the radiation to be received by the detector is absorbed.

In particular, the frame may comprise at least one region in which it is reflective and one region in which it is absorbing. For example, the first sub-region may be reflective and the second sub-region absorbing.

An absorbing or reflective configuration may for example be achieved by using an absorbing or reflective material for the entire frame or by coating the frame with an absorbing or reflective material. For example, the frame may be made from an absorbing material and coated in places with a reflective material, or vice versa.

According to at least one embodiment of the optoelectronic apparatus, the second sub-region extends between the radiation passage side and a lower edge. The lower edge is spaced from the back in the vertical direction. In other words, in the second sub-region the obliquely extending side face does not extend from the radiation passage side to the back.

According to at least one embodiment of the optoelectronic apparatus, the orifice comprises an undercut region, in particular when viewed from the radiation passage side. An undercut region is generally understood to mean a region in which the extent of the orifice in at least one lateral direction, i.e. in a direction extending perpendicular to the vertical direction, is greater than the extent in the same lateral direction at a point of the orifice closer to the radiation passage side.

The undercut region may in particular be formed between the lower edge and the back of the frame. The lower edge may thus form a transition between the obliquely extending side face and the undercut region. In particular, the orifice may in sectional view comprise a kink or a curved region at the lower edge.

According to at least one embodiment of the optoelectronic apparatus, a midline extending in particular through the detector in plan view onto the radiation passage side separates the first sub-region from the second sub-region. A plane defined by the midline and the vertical direction thus divides the orifice into two half-spaces, wherein the radiation impinging vertically in the one half-space impinges predominantly on the detector and the radiation impinging in the other half-space is predominantly guided away from the detector.

According to at least one embodiment of the optoelectronic apparatus, the orifice has a smaller cross-sectional area at the radiation passage side than at the back of the frame. The cross-sectional area at the back of the frame in particular determines the space available for installation of the detector. In particular, the cross-sectional area at the radiation passage side may lie completely within the cross-sectional area at the back when the apparatus is viewed in plan view.

According to at least one embodiment of the optoelectronic apparatus, the apparatus has a connection carrier. The connection carrier may be connected in particular mechanically stably and durably with the back of the frame, for example by means of a bonding layer, for instance an adhesive layer. The detector may be mounted on the connection carrier and furthermore electrically contacted. The connection carrier may for example be a circuit board, for instance a printed circuit board. A lead frame may also be used for the connection carrier.

In the lateral direction the frame may terminate flush with the connection carrier at least in places, in particular over the entire circumference of the apparatus. Furthermore, the apparatus may also take the form of a surface mounted device (SMD). For example, the connection carrier may comprise contact surfaces for external electrical contacting on the side remote from the frame.

According to at least one embodiment of the optoelectronic apparatus, the latter comprises an emitter provided to generate radiation. The emitter may be arranged in a further orifice of the frame. The orifice and the further orifice are spaced from one another in the lateral direction. The emitter and detector are separated optically from one another by the material of the frame arranged between the orifices. There is thus no direct ray path between the emitter and the detector. The emitter may be configured to generate the radiation to be received by the detector. In other words, the emitter and detector may form an emitter-detector pair.

According to at least one embodiment of the optoelectronic apparatus, a side face of the further orifice is parabolic in shape at least in places. Radiation emitted by the emitter and impinging on the side face of the further orifice is guided at least in part in the vertical direction.

According to at least one embodiment of the optoelectronic apparatus, the apparatus takes the form of a proximity sensor. When the apparatus is operated in a hardware item, for example a communications device or a data processing device, the apparatus is conveniently arranged behind a radiation window, wherein the detector is provided to receive radiation emitted by the emitter, passing through the radiation window and reflected at a target object.

According to at least one embodiment of the optoelectronic apparatus, the optoelectronic device comprises a detector provided to receive radiation and a frame, wherein formed in the frame is an orifice, in which the detector is arranged. The frame extends in a vertical direction between a radiation passage side and a back. The orifice comprises a side face, which extends obliquely to the vertical direction. In plan view onto the radiation passage side the obliquely extending side face comprises a first sub-region and a second sub-region. The first sub-region takes the form of a reflector for the radiation to be received by the detector. The second sub-region guides radiation impinging in the vertical direction on the second sub-region away from the detector.

In particular, a midline extending through the detector in plan view onto the radiation passage side may separate the first sub-region from the second sub-region. The apparatus may comprise an emitter provided to generate radiation, which is arranged in a further orifice in the frame. The first sub-region may be arranged on the side of the midline facing the emitter. Furthermore, the second sub-region may be arranged on the side of the midline remote from the emitter.

Further features, configurations and convenient aspects are revealed by the following description of the exemplary embodiments in conjunction with the figures, in which:

FIGS. 1A to 1E show an exemplary embodiment of an optoelectronic apparatus in plan view (FIG. 1A and associated sectional views in FIGS. 1B to 1E);

Identical, similar or identically acting elements are provided with the same reference numerals in the figures.

The figures and the size ratios of the elements illustrated in the figures relative to one another are not to be regarded as being to scale. Rather, individual elements and in particular layer thicknesses may be illustrated on an exaggeratedly large scale for greater ease of depiction and/or better comprehension.

Figure 1C:
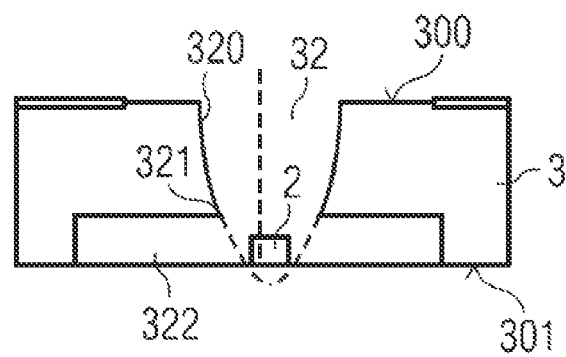
Figure 1D:
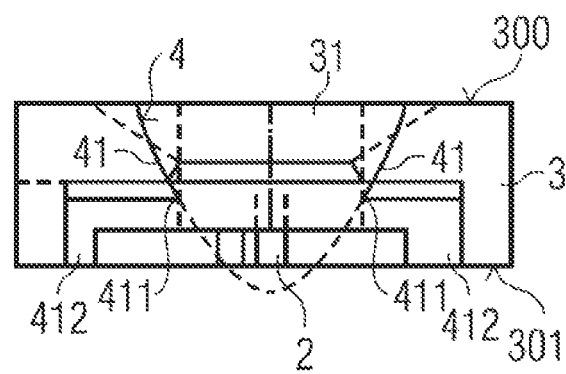
Figure 1E:
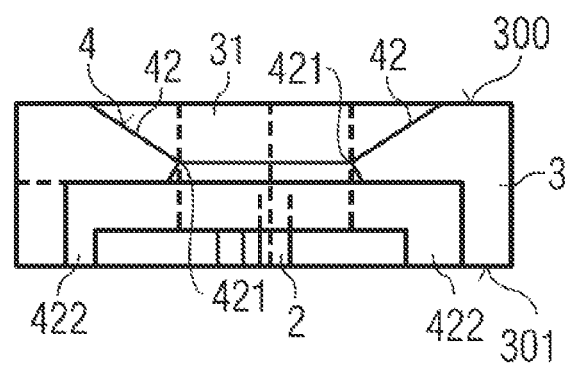

An exemplary embodiment of an optoelectronic apparatus 1 is shown schematically in FIGS. 1A to 1E by means of a plan view and associated sectional views in the longitudinal direction along line B-B' (FIG. 1B) and in the transverse direction (FIGS. 1C to 1E).

The optoelectronic apparatus 1 comprises a connection carrier 5, on which a detector 2 and an emitter 25 are arranged and electrically contacted. The connection carrier may for example take the form of a circuit board, in particular a printed circuit board. A lead frame may also be used for the connection carrier. The electrically conductive connection is formed at least in part by means of connecting lines 51, for example bonding wires. Depending on the devices used, however, another type of electrical connection may also be used, for example soldering or adhesive bonding with an electrically conductive adhesive.

In the exemplary embodiment shown, the optoelectronic apparatus 1 takes the form of a proximity sensor, in which the emitter 25 and the detector 2 form an emitter-detector pair. The detector 2 is provided to receive the target radiation 72 emitted by the emitter 25 and, in the case of mounting in an item of hardware, for example a mobile communications device or computer, behind a radiation window 7, passing through said window and reflected at a target object 71 (FIG. 1B).

Preferably, the emitter 25 emits radiation in the near infrared range, particularly preferably in the wavelength range between 800 nm and 1000 nm inclusive.

A frame 3 is arranged on the connection carrier 5. The frame extends in a vertical direction between a radiation passage side 300 and a back 301 facing the connection carrier 5. The frame 3 is preferably a plastics moulding. The frame may for example be produced inexpensively by injection moulding or transfer moulding. However, mechanical methods such as for example milling may also be used to form the frame. The frame 3 is configured to be radiation-opaque for the radiation to be received by the detector.

An orifice 31 and a further orifice 32 are formed in the frame. The orifices each extend vertically through the frame 3. The orifices are spaced laterally from one another, such that the frame separates the detector 2 optically from the emitter 25. The detector 2 is arranged in the orifice 31, such that radiation impinging perpendicularly on the optoelectronic apparatus 1 impinges in part directly on the detector 2. The orifice 31 comprises a side face 4, which extends obliquely to the vertical direction. The side face 4 is visible in plan view onto the apparatus 1.

In a first sub-region 41 of the obliquely extending side face 4, the sub-region takes the form of a reflector for the radiation to be received by the detector 2. In the exemplary embodiment shown, the first sub-region 41 is parabolic in shape, wherein the detector 2 is located in the focal point of the reflector. Radiation impinging on the first sub-region 41 is thus deflected at least in part diffusely or in directed manner onto the detector 2. In this way, the total radiant power impinging on the detector is increased.

In a second sub-region 42 the side face 4 is arranged and configured in such a way relative to the detector 2 that radiation reflected diffusely or in directed manner at the second sub-region 42 cannot impinge directly on the detector 2. In the exemplary embodiment shown, the inclination of the side face 4 in the second sub-region 42 is such that a notional extension of the side face extends over the photosensitive region of the detector 2. This ensures that radiation reflected diffusely at any desired angle at the second sub-region 42 also cannot impinge directly on the detector 2.

It has been revealed that the efficiency of the proximity sensor may be increased by means of the first sub-region 41 formed as a reflector due to the elevated detected radiation portion. Simulations have shown that, as a result of the described configuration of the first sub-region 41, the signal strength of the detector 2 may be increased by approximately a factor of 2 in comparison with a component without such a sub-region configured as a reflector. The range may be increased while retaining identical emitter radiant power. Alternatively, power consumption can be reduced for the same range.

The configuration of the second sub-region 42 furthermore prevents stray radiation (shown in FIG. 1B by arrows 73), which is for example reflected at the radiation window 7 and does not originate from a target object 71, from being guided onto the detector 2 and there leading to an undesired signal component.

To reduce stray radiation, the frame 3 is preferably configured at least in part to be absorbing for the radiation to be detected. Preferably, the frame absorbs at least 80% of the impinging radiation at least in places. The entire frame 3 may also be absorbing. For an absorbing configuration, the frame may be made from an absorbing material, for example a black plastics material, or coated with an absorbing material.

The first sub-region 41 of the side face 4 and/or a reflector face 320 of the further orifice 32 may be made reflective, for example by means of a reflective coating, to increase reflectivity. A suitable reflective material is for example a metal or a metal alloy or a plastics material, which may be filled with particles, for example titanium oxide particles, to increase reflectivity.

For simplified electrical contacting, the further orifice 32 comprises a recess 325 for accommodating the connecting line 51. Apart from this recess, the reflector face 320 is rotationally symmetrical. Depending on the type of electrical contacting for the emitter 25, it may also be possible to omit such a recess. It goes without saying, however, that more than one recess may also be favourable.

In plan view onto the frame 3, the first sub-region 41 and second sub-region 42 are separated from one another by a midline 30, wherein the midline extends perpendicularly or substantially perpendicularly, for example with a deviation of at most 10°, to a connecting line between the detector and the emitter. Moreover, the midline 30 extends through the detector 2. The second sub-region 42 is arranged on the side of the midline which is further away from the emitter 25. It has been found that in this way the stray radiation component may be reduced particularly efficiently.

The second sub-region 42 extends from the radiation passage side 300 to a lower edge 421. The lower edge is spaced vertically from the back 301. Between the lower edge 421 and the back 301 an undercut region 422 is formed. By means of the undercut region 422, the orifice 31 may be formed such that no point of the inner surface of the orifice 31 on the side remote from the midline 30 can guide radiation entering the orifice and impinging directly on the inner surface directly onto the detector.

Furthermore, the obliquely extending side face extends in the first sub-region 41 in the vertical direction between the radiation passage side and a lower edge 411. Between the lower edge 411 and the back 301 an undercut region 412 is formed.

Furthermore, the further orifice 32 also comprises a lower edge 321 and an undercut region 322. The reflector face 320 extends between the lower edge 321 and the radiation passage side 300.

By means of the undercut regions, the space available for mounting the detector 2 or the emitter 25 may be increased.

The cross-sectional area 35 of the first orifice and the cross-sectional area of the second orifice at the radiation entrance side 300 are in each case less than the associated cross-sectional areas 36 and 38 respectively at the back 301. Mounting of the detector 2 and of the emitter 25 is simplified thereby.

FIGS. 1C to 1E show sections in the transverse direction along lines C-C', D-D' and E-E' respectively. In these views the connection carrier 5 and the cover 8 are not shown, to simplify the illustration. The side face of the further orifice 32 comprises a reflector face 320. Like the first sub-region 41 of the side face 4 of the orifice 31, this is parabolic in shape, wherein the emitter 25 or the detector 2 are each located in the region of the focal point of the reflector.

A sectional view of the second sub-region 42 is shown in FIG. 1E. On both sides of the detector 2, the side faces are in each case bevelled such that radiation impinging on the second sub-region 42 and radiation reflected in directed or diffuse manner at any desired angle cannot impinge on the detector 2 without further reflection.

The emitter 25 preferably takes the form of a luminescent diode, for example a light-emitting diode. The detector 2 may for example be a photodiode, a phototransistor or an application-specific integrated circuit (ASIC) with a photosensitive region. In particular, the emitter and/or the detector may take the form of unhoused semiconductor chips. A particularly compact configuration of the apparatus is thus simplified. In principle, however, devices may also be used which themselves comprise a housing.

In addition to the detector 2, a further detector 21 may also be arranged in the orifice 31, as shown in FIG. 1A. The further detector may for example take the form of an ambient light sensor. The detector and the further detector may take the form of separate devices or be integrated into one device.

On the radiation passage side 300 of the frame 3 a cover 8 may be formed. The cover may for example take the form of a rigid plate or of a flexible film, for instance a self-adhesive film. The cover may serve to protect the detector 2 and the emitter 25. It is possible to dispense with additional encapsulation of the devices. This means that the emitter and the detector and optionally the connecting lines 51 may be free of an adjoining potting material.

In the lateral direction the connection carrier 5, the frame 3 and optionally the cover 8 terminate flush with one another. Such optoelectronic apparatuses 1 may be manufactured in an assembly and subsequently singulated by separation into individual apparatuses. Production is therefore particularly cost-effective.

The optoelectronic apparatus 1 is surface-mountable. For external electrical contacting it comprises, on the side of the connection carrier 5 remote from the frame 3, electrical contacts (not shown explicitly) via which the emitter 25, the detector 2 and optionally the further detector 21 may be electrically contacted.

It goes without saying that, unlike in the exemplary embodiment described, the optoelectronic apparatus 1 may also comprise just one detector 2 or a plurality of detectors without an emitter 25. The described configuration of the side face 4 of the orifice 31 with a first sub-region 41 and a second sub-region 42 is suitable in general for detectors in which radiation impinging on the apparatus from different directions and/or at different angles is intended to contribute with different weightings to the signal of the detector. The radiation to be detected may for example lie in the visible, ultraviolet or infrared spectral range.

Figure 2:
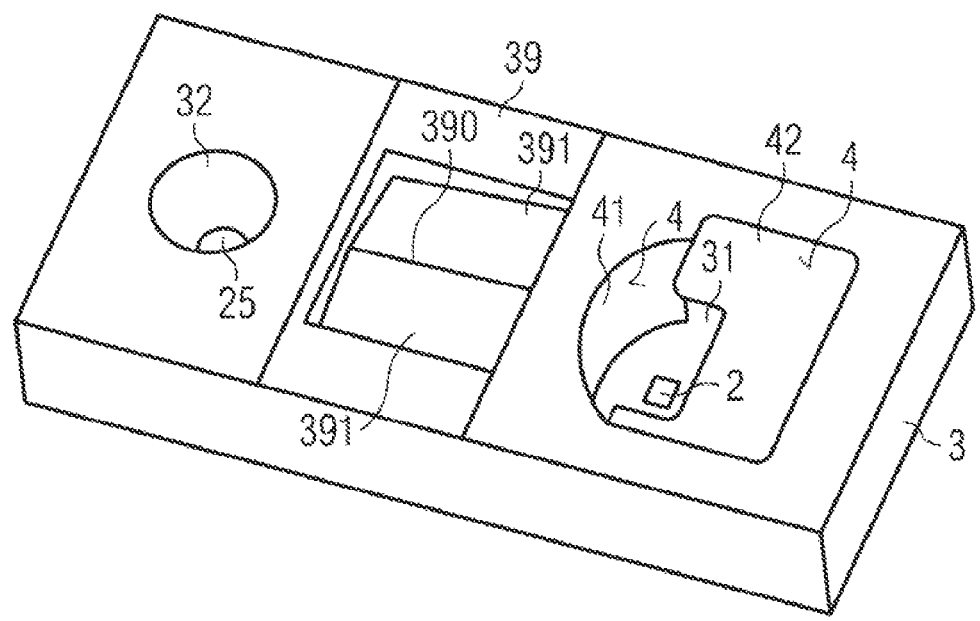
FIG. 2 shows a further exemplary embodiment of an optoelectronic apparatus in perspective representation.

A second exemplary embodiment of an optoelectronic apparatus is shown in perspective view in FIG. 2. This second exemplary embodiment substantially corresponds to the first exemplary embodiment described in relation to FIGS. 1A to 1E.

In contrast therewith, the radiation passage side 300 of the frame 3 comprises an intermediate region 39 between the orifice 31 and the further orifice 32. The intermediate region is configured such that for example stray radiation reflected at a radiation window 7, which impinges on the intermediate region 39, cannot impinge or can impinge at least only to a greatly reduced extent on the detector.

In the exemplary embodiment shown the intermediate region comprises a ridge 390, which extends parallel or substantially parallel, i.e. with a deviation of at most 10°, to a connecting line between the emitter 25 and the detector 2. On at least one side of the ridge, in the exemplary embodiment shown on both sides of the ridge, an inclined region 391 is formed. The thickness of the frame 3 thus decreases as the distance from the ridge increases. As a result of the inclined regions 391, radiation impinging on these regions is guided away from a plane which is defined by the connecting line between emitter 25 and detector 2 and the vertical direction. This makes it possible to reduce to a greater extent an undesired stray radiation portion in a proximity sensor.

Figure 3:
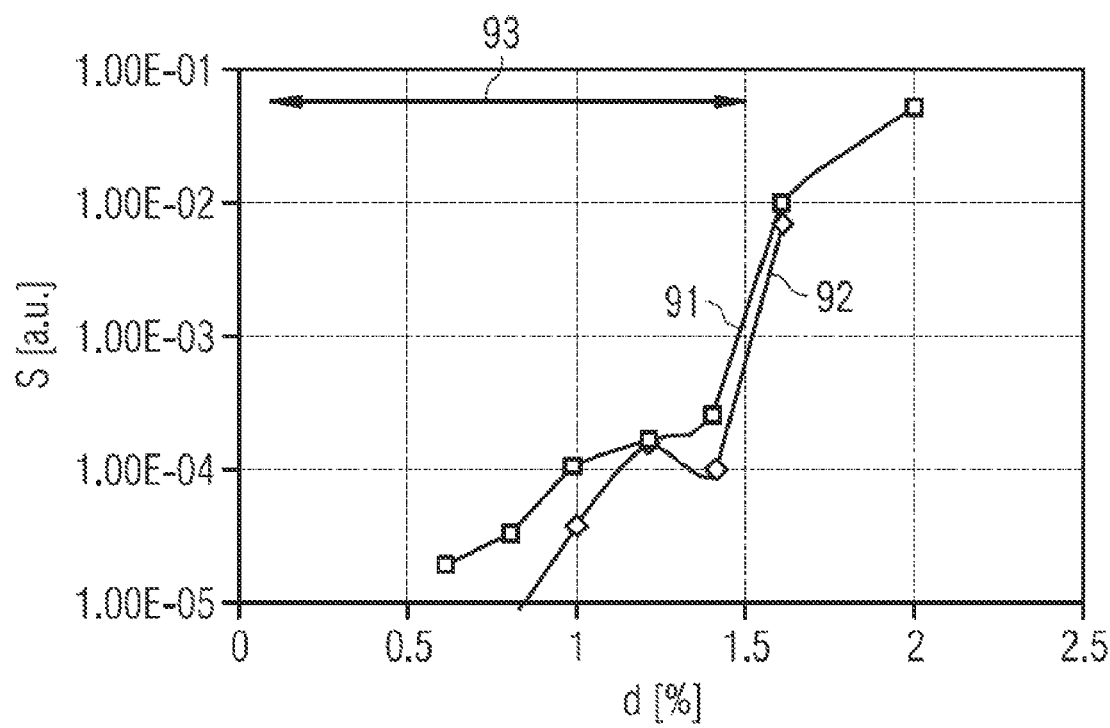
FIG. 3 shows simulation results for a detector signal S as a function of a distance d between the detector and a reflecting surface with a reflectivity of 10% for an apparatus with a first sub-region in comparison with an apparatus without such a sub-region.

FIG. 3 shows results for simulation of the crosstalk between emitter and detector. The simulations show the detector signal S in arbitrary units as a function of an air gap between the radiation entrance side of the optoelectronic apparatus and a mirror with a reflectivity of 10% plotted against the size d of the air gap. The size d is stated in percent relative to the distance between emitter and detector.

The curve 91 relates to an apparatus with a first sub-region 41 embodied as described above and the curve 92 relates to a reference apparatus without such a sub-region. An arrow 93 shows the region in which virtually no crosstalk takes place. The signal component here originates from interreflections. For larger distances the signal increases. The simulations show that both apparatuses exhibit similar behaviour. This means that, using the described configuration of the first sub-region and of the second sub-region, it is possible to ensure that the detector signal is increased considerably and this nonetheless does not lead to any significant increase in the undesired signal component caused by crosstalk.

This patent application claims priority from German patent application 10 2012 107 794.0, the disclosure content of which is hereby included by reference.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic apparatus having a detector provided to receive radiation and a frame, wherein
    formed in the frame is an orifice, in which the detector is arranged;
    the frame extends in a vertical direction between a radiation passage side and a back;
    the orifice comprises a side face, which extends obliquely to the vertical direction;
    the obliquely extending side face has a first sub-region and a second sub-region in plan view onto the radiation passage side;
    the first sub-region takes the form of a reflector for the radiation to be received by the detector;
    the second sub-region guides radiation impinging in the vertical direction on the second sub-region away from the detector; and
    a midline extending through the detector in plan view onto the radiation passage side separates the first sub-region from the second sub-region.

2. The optoelectronic apparatus according to claim 1, wherein the first sub-region is parabolic in shape at least in places.

3. The optoelectronic apparatus according to claim 1, wherein the second sub-region extends between the radiation passage side and a lower edge, and wherein the lower edge is spaced vertically from the back.

4. The optoelectronic apparatus according to claim 3, the orifice between the lower edge and the back comprises an undercut region.

5. The optoelectronic apparatus according to claim 1, wherein the orifice has a smaller cross-sectional area at the radiation passage side than at the back.

6. The optoelectronic apparatus according to claim 1, wherein the apparatus comprises a connection carrier, which is connected with the back of the frame and on which the detector is mounted.

7. The optoelectronic apparatus according to claim 6, wherein the frame terminates flush with the connection carrier at least in places in the lateral direction.

8. The optoelectronic apparatus according to claim 6, wherein the connection carrier is a circuit board.

9. The optoelectronic apparatus according to claim 1, wherein the apparatus comprises an emitter provided to generate radiation, which emitter is arranged in a further orifice in the frame.

10. The optoelectronic apparatus according to claim 9, wherein a side face of the further orifice is parabolic in shape at least in places.

11. The optoelectronic apparatus according to claim 9, wherein in plan view onto the apparatus the first sub-region is arranged closer to the emitter than the second sub-region.

12. The optoelectronic apparatus according to claim 9, wherein the apparatus takes the form of a proximity sensor.

13. The optoelectronic apparatus according to claim 1, wherein the frame takes the form of a plastics moulding.

14. The optoelectronic apparatus according to claim 1, wherein
- the apparatus comprises an emitter provided to generate radiation, which emitter is arranged in a further orifice in the frame; and
- the first sub-region is arranged on the side of the midline facing the emitter.

15. The optoelectronic apparatus according to claim 1, wherein the first sub-region is shaped such that radiation impinging in the vertical direction onto the first sub-region is guided onto the detector.

16. The optoelectronic apparatus according to claim 1, wherein the first sub-region is reflective and the second sub-region is absorbing.

* * * * *